US012675621B2

(12) United States Patent
Weber

(10) Patent No.: US 12,675,621 B2
(45) Date of Patent: Jul. 7, 2026

(54) AUTOMATIC LOW LEVEL OPERATOR LOOP GENERATION, PARALLELIZATION AND VECTORIZATION FOR TENSOR COMPUTATIONS

(71) Applicant: NEC Laboratories Europe GmbH, Heidelberg (DE)

(72) Inventor: Nicolas Weber, Heidelberg (DE)

(73) Assignee: NEC CORPORATION, Tokyo (JP)

( * ) Notice: Subject to any disclaimer, the term of this patent is extended or adjusted under 35 U.S.C. 154(b) by 892 days.

(21) Appl. No.: 17/964,085

(22) Filed: Oct. 12, 2022

(65) Prior Publication Data

US 2024/0028802 A1 Jan. 25, 2024

Related U.S. Application Data

(60) Provisional application No. 63/390,677, filed on Jul. 20, 2022.

(51) Int. Cl.
G06F 30/323 (2020.01)
G06F 30/327 (2020.01)

(52) U.S. Cl.
CPC .......... G06F 30/323 (2020.01); G06F 30/327 (2020.01)

(58) Field of Classification Search
CPC .............................. G06F 30/323; G06F 30/327
See application file for complete search history.

(56) References Cited

U.S. PATENT DOCUMENTS

| | | | |
|---|---|---|---|
| 9,779,786 B1 | 10/2017 | Wu et al. | |
| 10,248,908 B2 | 4/2019 | Temam et al. | |
| 2014/0188961 A1 | 7/2014 | Plotnikov et al. | |
| 2018/0197068 A1 | 7/2018 | Narayanaswami et al. | |

(Continued)

FOREIGN PATENT DOCUMENTS

CN 111831429 A 10/2020

OTHER PUBLICATIONS

Georganas, Evangelos et al.; "*Tensor Processing Primitives: A Programming Abstraction for Efficiency and Portability in Deep Learning Workloads*"; Apr. 14, 2021; pp. 1-14; vol. 2; ArXiv.org; Cornell University; Ithaca, New York, USA.

(Continued)

*Primary Examiner* — Jack Chiang

*Assistant Examiner* — Aric Lin

(74) *Attorney, Agent, or Firm* — Leydig, Voit & Mayer, Ltd.

(57) ABSTRACT

A method is provided for transforming a high-level language representation of a tensor computation graph into a low level language. The method includes assigning a tensor shape and a loop primitive. The method also includes generating, from the tensor computation graph and the assigned loop primitives, an initial loop structure. The method further includes positioning the layers of the tensor computation graph within a nested loop structure to provide a final loop structure, collapsing loops in the final loop structure, and mapping the collapsed loops to hardware components configured to execute the collapsed loops. The method can be applied to artificial intelligence (AI) and machine learning (ML) use cases for improved optimization of neural networks including compilation optimization for improving performance of simulations such as medical simulations, healthcare simulations, weather simulations, and/or simulations related to other complex systems, which can also support decision making.

20 Claims, 6 Drawing Sheets

(56) References Cited

U.S. PATENT DOCUMENTS

| | | |
|---|---|---|
| 2019/0228301 A1 | 7/2019 | Thorson et al. |
| 2019/0244091 A1 | 8/2019 | Weber et al. |

OTHER PUBLICATIONS

Fegade, Pratik et al.; "*The Cora Tensor Compiler: Compilation for Ragged Tensors With Minimal Padding*"; Oct. 19, 2021; pp. 1-23; vol. 1; ArXiv.org; Cornell University; Ithaca, New York, USA.

NEC Laboratories Europe GmbH; "*SOL—Systems and Machine Learning*"; SOL Transparent Neural Network Acceleration; Mar. 26, 2022; pp. 1-3; [Online] Retrieved from internet: sysml.neclab.eu/projects/sol/; Heidelberg, Germany.

Ma, Mingfei et al.; "*Accelerating PyTorch Vision Models with Channels Last on CPU*"; PyTorch; Aug. 24, 2022; pp. 1-3; [Online] Retrieved from internet: https://pytorch.org/blog/accelerating-pytorch-vision-models-with-channels-last-on-cpu/; San Francisco, California, USA.

Dias, Adhitha et al.; "*SparseLNR: Accelerating Sparse Tensor Computations Using Loop Nest Restructuring*"; May 23, 2022; pp. 1-14; ISBN 978-1-4503-9281; ArXiv.org; Cornell University; Ithaca, New York, USA.

Liu, Xiao-Yang et al.; "High Performance Computing Primitives for Tensor Networks Learning Operations on GPUs"; 34th Conference on Neural Information Processing Systems (NeurIPS 2020); Dec. 2020; pp. 1-9; [Online] Retrieved from internet: https://tensorworkshop.github.io; Vancouver, Canada.

Tian, Ruiqin et al.; "*A High-Performance Sparse Tensor Algebra Compiler in Multi-Level IR*"; Feb. 9, 2021; pp. 1-12; vol. 1; ArXiv.org; Cornell University; Ithaca, New York, USA.

Manzer, Samuel et al.; "*A General Sparse Tensor Framework for Electronic Structure Theory*"; Journal of Chemical Theory and Computation; Jan. 24, 2017; pp. 1108-1116; vol. 13, No. 3; American Chemical Society Publications; Washington, USA.

Pytorch; "*Torch.Einsum*"; PyTorch 1.13 documentation; Dec. 2022; pp. 1-3; [Online] Retrieved from internet: https://pytorch.org/docs/stable/generated/torch.einsum.html; PyTorch Contributors; San Francisco, CA, USA.

Intel—Oneapi; "*struct dnnl_post_ops*"; oneDNN v3.0.0 documentation; Dec. 2022; p. 1; [Online] Retrieved from internet: https://oneapi-src.github.io/oneDNN/struct_dnnl_post_ops.html; Intel Corporation; California, USA.

Chen, Tianqi et al.; "*TVM: End-to-End Optimization Stack for Deep Learning*"; University of Washington Technical Report UW-CSE; Dec. 1, 2017; pp. 1-19; University of Washington; Seattle, WA, USA.

Chen, Tianqi et al.; "*TVM: An Automated End-to-End Optimizing Compiler for Deep Learning*"; Oct. 5, 2018; pp. 1-16; vol. 3; ArXiv.org; Cornell University; Ithaca, New York, USA.

Vasilache, Nicolas et al.; "Tensor Comprehensions: Framework-Agnostic High-Performance Machine Learning Abstractions"; Facebook AI Research Technical Report; Jun. 29, 2018; pp. 1-37; vol. 3; ArXiv.org; Cornell University; Ithaca, New York, USA.

AUTOMATIC LOW LEVEL OPERATOR LOOP GENERATION, PARALLELIZATION AND VECTORIZATION FOR TENSOR COMPUTATIONS

CROSS-REFERENCE TO PRIOR APPLICATION

Priority is claimed to U.S. provisional Application No. 63/390,677, filed on Jul. 20, 2022, the entire disclosure of which is hereby incorporated by reference herein.

FIELD

The present invention relates to a method, system and computer-readable medium for automatic low level operator loop generation, parallelization, and vectorization for tensor computations.

BACKGROUND

Modern tensor-based programming models pose optimization problems to compilers that need to enable generation of efficient parallelizable and vectorizable code, for any kind of complex mathematical computations. This is explicitly hard in multi-path computations, where the compiler needs to identify parts that can be scheduled onto the same loop structure.

The availability of modern high level API frameworks like Numpy, Tensorflow or PyTorch have enabled application developers to easily express complex computations in mathematical tensor expressions. However, while this type of programming is very convenient to use, it poses problems for efficient execution on any type of hardware, as two consecutive tensor operations expect that the previous has been executed already. With ever growing data amounts this means, that even simple operations, such as an add, need to read all input elements and write all output elements before any adjacent operation can be executed. This puts high pressure on any memory and cache system as no intermediate results can be kept within the caches, resulting in wasted energy and low performance.

One possible strategy is manual layer/operation merging such as in libraries as OneDNN [2]. OneDNN enables users to append elementwise operations to most high level layers such as general matrix multiply (GEMM) or Convolutions, which then either use a preprogrammed specific implementation, or performs just-in-time (JIT) compilation using a function template. While this is easy to implement, it only enables very simplistic merging of operations such as shown in the pseudo-code below:

```
for w in write_loops:
    # Main Operation
    result = inner_part_of_main_operation(input)
    # Merged Elementwise Operation
    result = elementwise_operation(result)
    output[w] = result
```

A slight improvement to manual merging is employed in TVM [4], a neural network compiler that utilizes a rule-based fusion (see FIG. 5 in their paper). For example, a sequence of conv2d>batchnorm>relu (i.e. a sequence of 3 layers: 2D-convolution, batch normalization, and rectified linear unit (ReLU)) gets transformed into the merged fused-conv2d-bn-relu layer (i.e. a specially merged 2D-convolution, batch normalization, and ReLU layer). This requires to define fusion receipts for any kind of sequence manually and therefore does not scale, as it cannot be automated.

More complex solutions such as Tensor Comprehensions [6] (or nowadays torch.einsum [1]) enable use of the so-called "Einstein-Notation" to express computations. An example is "ii" which is the sum of a 2D tensor, or "bij,bjk->bik" which is the batch matrix computations. Every used letter represents one linear loop. So the batch matrix computations example boils down to, using Einstein notation:

```
for b in range(...):
    for i in range(...):
        for k in range(...):
            sum = 0
            for j in range(...):
                sum += input[b][i][j] * weights[b][j][k]
            output[b][i][k]
```

This is much more flexible than the previous approach, but still only enables the use of pure linear loops. So layers such as poolings or interpolation layers cannot be expressed. Further, it requires the user to manually merge all layers into this kind of expression. So there is no automatism that translates entire compute graphs into this kind of notation.

The actual implementation within frameworks like PyTorch further reveals, that the Einstein-Notation mainly allows matrix-multiplication-like operations, so nowadays the Einstein-Notation is translated into calls to basic linear algebra subprograms (BLAS) compute libraries, instead of JIT compiling an optimized version as done by Tensor Comprehensions.

In U.S. patent application Ser. No. 15/889,275 [3], another method for doing such merging is expressed. Different types of computations are declared such as "Cube" (3D), "Square" (2D), "Rows" (1D) or "Element-Wise" (0D). The method provides for layers/operations of the same dimensionality or lower to be merged. Here an example of Convolution (3D) >Bias (0D)>AvgPooling (2D)>ReLU (0D) is shown:

```
# Convolution 3D
for batch in range(...):
    for out_channels in range(...):
        for y in range(...):
            for x in range(...):
                sum = 0
                for in_channels in range(...):
                    for kernel_y in range(...):
                        for kernel_x in range(...):
                            sum += input[batch][out_channels][y +
kernel_y][x + kernel_x] *
weight[out_channels][in_channels][kernel_y][kernel_x]
    L0[batch][out_channels][y][x] = sum
# Bias 0D
for batch in range(...):
    for channels in range(...):
        for y in range(...):
            for x in range(...):
                L1[batch][channels][y][x] = L0[batch][channels][y][x] +
bias[channels]
# AvgPooling 2D
for batch in range(...):
    for channels in range(...):
        for y in range(...):
            for x in range(...):
                sum = 0
                for kernel_y in range(...):
                    for kernel_x in range(...):
                        sum += L1[batch][channels][y + kernel_y][x +
kernel_x]
```

3
-continued

```
        L2[batch][channels][y][x] = sum / (X * Y)
# ReLU 0D
for batch in range(...):
    for channels in range(...):
        for y in range(...):
            for x in range(...):
                L3[batch][channels][y][x] = max(L2[batch][channels][y][x], 0)
```

Depth First Parallelism (DFP) would then enable the loops to be merged in the following way, significantly reducing the required memory bandwidth thereby enabling date to be cached much more efficiently. DFP-optimized loop structures are provided below:

```
for batch in range(...):
    for out_channels in range(...):
# Convolution 3D
for y in range(...):
    for x in range(...):
        sum = 0
        for in_channels in range(...):
            for kernel_y in range(...):
                for kernel_x in range(...):
                    sum += input[batch][out_channels][y + kernel_y][x +
kernel_x] * weight[out_channels][in_channels][kernel_y][kernel_x]
        L0 = sum
# Bias 0D
L1[y][x] = L0 + bias[channels]
# AvgPooling 2D
for y in range(...):
    for x in range(...):
        sum = 0
        for kernel_y in range(...):
            for kernel_x in range(...):
                sum += input[y + kernel_y][x + kernel_x]
        L2 = sum / (X * Y)
# ReLU 0D
L3[batch][channels][y][x] = max(L2, 0)
```

However, this approach is limited to the previously defined ND-wise merging. Another limitation is that it can only cover directly connected layers and cannot merge parallel compute paths such as in the complex parallel computation graph illustrated in FIG. 1.

In the example parallel computation graph illustrated in FIG. 1, DFP can only merge B0+B1+B2+B3 but cannot merge them with C0, D0 and E0, although they are just elementwise operations.

More modern versions of TVM [5] use a DFP-like approach, with manually classifying the operations as "injective" (elementwise), "reduction" (not part of DFP patent), "complex-out-fusable" (cube/square/rows) or "opaque" (not mergeable).

Each of the aforementioned methods have significant limitations and often require substantial manual effort—either by the end user (as is the case with Einstein-Notation) or by the framework developers.

SUMMARY

According to an embodiment, a method is provided for transforming a high-level language representation of a tensor computation graph into a low level language. The method includes assigning, for each input edge of each node in the tensor computation graph, a tensor shape, assigning, for each dimension of the input and output of each layer of the tensor computation graph, a loop primitive, and generating, from the tensor computation graph and the assigned loop primitives, an initial loop structure. The method further includes positioning the layers of the tensor computation graph within a nested loop structure to provide a final loop structure, collapsing loops in the final loop structure, and mapping the collapsed loops to hardware components configured to execute the collapsed loops. The method can be applied to artificial intelligence (AI) and machine learning (ML) use cases for improved optimization of neural networks including compilation optimization for improving performance of simulations such as medical simulations, healthcare simulations, weather simulations, and/or simulations related to other complex systems, which can also support decision making.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
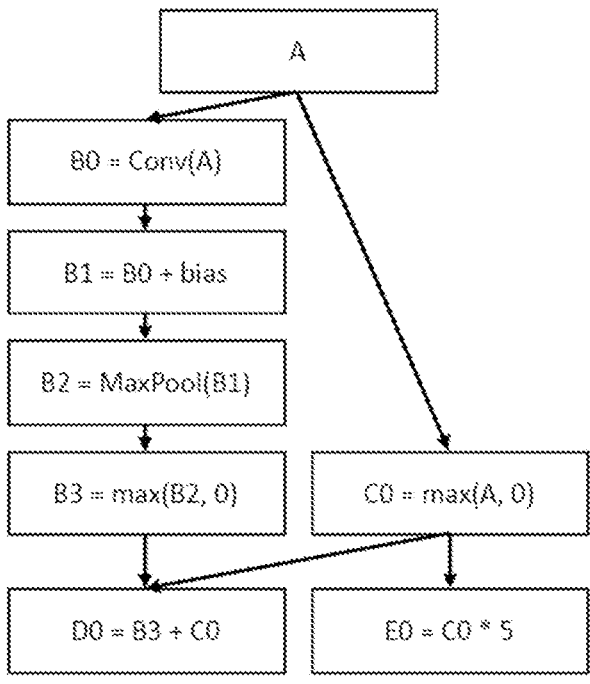
FIG. 1 illustrates a complex parallel computation graph.

The present disclosure provides systems, methods, and computer readable media that provide for improvements in the execution of tensor computations, both by increasing the speed of execution of tensor computations and by decreasing the amount of energy required to perform tensor computations. The present disclosure thereby provides techniques that represent an acceleration of tensor computations by CPUs and/or GPUs thereby improving the performance of a multitude of processes that rely on tensor computations—including, e.g., artificial intelligence, biomedical simulation, weather simulation, and simulations related to other complex systems. The present disclosure provides systems, methods, and computer readable media for transforming any kind of tensor computation graph (e.g. as provided in any tensor mathematics source code), including non-linear index calculations and merging of parallel data paths, into very efficient low level code for any kind of vector-like processor (e.g. CPU, GPU, scalar or vector processors). The techniques provided by the present disclosure are purely rule based and do not require any expensive auto-tuning or other computationally intensive algorithms. Therefore, the techniques provided by the present disclosure can be used for just-in-time (JIT) compilation optimizations on any kind of hardware. The compilation optimization only needs to be performed once and can then be reused indefinitely for the same tensor computation graph.

Python frameworks, e.g. Numpy, PyTorch, TensorFlow, SciKit Learn, BioPython, have become very dominant in all fields of modern scientific computation programming. However, while they are convenient to use, and companies such as Facebook and Google invest enormous amounts of workforce to provide optimal computational performance, tensor compilers such as TVM or SOL (a tensor compiler that aims to optimize prediction and training of neural networks) still outperform these frameworks.

Such frameworks are traditional application-level tools that receive a list of instructions and execute them on demand. Tensor compilers, on the other hand, involve JIT compilation that, instead of immediately executing a tensor computation model, read the structure of the tensor computation model, compile an optimized version of the tensor computation model, and then execute the optimized version. Tensor compilers therefore typically have a longer setup time before they provide a final result in the first instance but are far more efficient in running multiple executions of the same tensor computation model. From the perspective of a user, there is typically only a single additional function call required to utilize a tensor compiler to perform JIT compilation. For example, in SOL the function call "model=sol.optimize(model, . . . )" can be used to perform JIT compilation.

While the artificial intelligence (AI) field is very crowded and has numerous technical contributors, less popular, niche fields (including the biomedical field) lack the resources to optimize computations for their specific applications. The techniques provided by the present disclosure are applicable to any kind of tensor arithmetical computations. Therefore, the techniques provided by the present disclosure do not map exclusively to AI, but instead map to numerous scientific computation fields, including the biomedical field, weather simulation applications, and other, similar fields.

Depending on particulars of a given tensor computation graph, the techniques provided by the present disclosure are capable of achieving at least one order of magnitude improvement in performance and energy consumption as compared with state-of-the-art—especially in areas where the state-of-the-art is not backed by large-scale engineering efforts, e.g. as are applied to AI platforms. The techniques provided by the present disclosure are capable of achieving, for example, a 16× increase in speed and a 10× reduction in energy consumption (as was achieved with TensorFlow running Recurrent Neural Networks (RNNs) with very small channel sizes and a batch size of 1 (i.e. batch size=1) on a CPU). For certain tensor computation graphs, the techniques provided by the present disclosure are capable of achieving >50× improvements over state-of-the art frameworks, particularly where hyperparameters of the tensor computation graph layers are especially unfavorable for the state-of-the-art frameworks (such as those frameworks developed for AI applications).

The techniques of the present disclosure are further capable of streamlining the transformation of a tensor computation graph into machine code by automatically optimizing the compiling of a tensor computation graph provided in a high-level language—irrespective of whether the tensor computation graph corresponds to a framework optimized for the particular high level language. While TorchVision models that are provided for PyTorch perform quite well in PyTorch, tensor computation graphs that do not correspond to any TorchVision model are unlikely to exhibit good performance. The techniques of the present disclosure, by contrast, provide high-performance machine code for tensor computation graphs that do not correspond to a framework optimized for any particular high-level language.

The present disclosure provides systems, methods, and computer readable media for assigning a shape onto input/output edges of an operation to enable the assignment of linear and non-linear loop primitives for each input/output edge within an operation, thereby reducing complexity of the optimization problem. In this manner, the present disclosure provides systems, methods, and computer readable media that provide a tensor computation graph in which edges define tensor shapes and the data flow and in which nodes define operations that are applied to incoming data. The systems, methods, and computer readable media provided by the present disclosure further involve ranking-based pre-scheduling that computes results directly before the results are used in a subsequent computation, inheriting linear loop indices across operation boundaries when data size and strides match, and tree-structure-based final scheduling to find a correct ordering of generated minimal loop structure. The systems, methods, and computer readable media provided by the present disclosure further involve distinguishing between write-, and read-loops, to steer the selection for optimal parallelization and vectorization of the minimal loop structure and mapping read loops onto write loops when the loop indices are identical, and splitting dimensions into loop- and data-size to enable offset/tiling-like operations without defining specific loop primitives.

The present disclosure provides systems, methods, and computer readable media for automatic low level operator loop generation, parallelization, and vectorization for tensor computations. For example, the systems, methods, and computer readable media translate computer code, e.g. code that provides a tensor computation graph, from a high level language (e.g. PyTorch, Numpy, TensorFlow, and any other language that models computations as a tensor-based programming model and/or generates a tensor computation graph) to a lower or low level language (e.g. C/C++ code and/or VHDL, Verilog, or any other language that maps directly onto hardware execution). The systems, methods, and computer readable media thereby transform a tensor computation graph from a high level language into, e.g., parallelized and vectorized loops at the machine code level.

According to an embodiment, a method is provided for transforming a tensor computation graph expressed in a high level programming language into low level machine code. The method includes defining an available set of operators, including the input-to-output shape mapping and per dimension loop primitives, initializing all loop primitives for all operations within the computation graph, creating an initial schedule, initializing all linear loops, initializing all non-linear loops, inheriting linear loops to direct neighbor nodes in the computation graph, and creating a final schedule. The method further includes generating a loop structure, collapsing loops, and assigning cores-, vector- and cores-vector loop types to loops.

Defining the available set of operators maps onto assigning a shape onto input/output edges of an operation to enable the assignment of linear and non-linear loop primitives for each input/output edge within an operation and splitting dimensions into loop- and data-size to enable offset/tiling-like operations without defining specific loop primitives. Initializing all loop primitives for all operations within the computation graph maps onto assigning a shape onto input/output edges of an operation to enable the assignment of linear and non-linear loop primitives for each input/output edge within an operation. Creating an initial schedule maps onto ranking-based pre-scheduling that computes results directly before the results are used in a subsequent computation, inheriting linear loop indices across operation boundaries when data size and strides match, and tree-structure-based final scheduling to find a correct ordering of generated minimal loop structure. Generating a loop structure and collapsing loops maps onto distinguishing between write-, and read-loops, to steer the selection for optimal parallelization and vectorization of the minimal loop structure and mapping read loops onto write loops when the loop indices are identical. Assigning cores-, vector-, and cores-vector loop types to loops maps onto distinguishing between write-, and read-loops, to steer the selection for optimal parallelization and vectorization of the minimal loop structure and mapping read loops onto write loops when the loop indices are identical, and splitting dimensions into loop- and data-size to enable offset/tiling-like operations without defining specific loop primitives.

According to an embodiment, a method is provided for transforming a high-level language representation of a tensor computation graph into a low level language. The method includes assigning, for each input edge of each node in the tensor computation graph, a tensor shape, assigning, for each dimension of the input and output of each layer of the tensor computation graph, a loop primitive, and generating, from the tensor computation graph and the assigned loop primitives, an initial loop structure. The method further includes positioning the layers of the tensor computation graph within a nested loop structure to provide a final loop structure, collapsing loops in the final loop structure, and mapping the collapsed loops to hardware components configured to execute the collapsed loops.

The method can further include defining, for the tensor computation graph, an available set of operators and loop primitives.

In an embodiment, the generating the initial loop structure includes generating an initial schedule for executing layers of the tensor computation graph, ranking, based on the initial schedule, the layers of the tensor computation graph, initializing linear loops according to loop primitives assigned to the dimensions of the input and output of each layer of the tensor computation graph, initializing non-linear loops based on the initialized linear loops; and inheriting linear loops to direct neighbor layers in the tensor computation graph. Einstein-Notation dimension mapping can be used for initializing the linear loops. Initializing linear loops according to the loop primitives assigned to the dimensions of the input and output of each layer of the tensor computation graph can be performed based on the ranking of the layers of the tensor computation graph.

In an embodiment, the positioning of the layers of the tensor computation graph within a nested loop structure to provide a final loop structure includes generating a hierarchical tree structure that includes loops and all layers of the tensor computation graph, determining, based on the hierarchical tree structure, dependencies of the loops, and classifying the loops as one of a write-loop or a read-loop.

In an embodiment, the mapping the collapsed loops to hardware components configured to execute the collapsed loops is performed by an auto-vectorizing compiler.

The high level language can be a tensor-based programming model, the low level language can be machine code, e.g. for a CPU or a GPU. The low level language can also be C/C++, very high-speed integrated circuits program (VHSIC) hardware description language (VHDL), or Verilog, for example.

According to an embodiment, a non-transitory computer readable medium is provided having stored thereon instructions for carrying out a method for transforming a high-level language representation of a tensor computation graph into a low level language. The method includes assigning, for each input edge of each node in the tensor computation graph, a tensor shape, assigning, for each dimension of the input and output of each layer of the tensor computation graph, a loop primitive, and generating, from the tensor computation graph and the assigned loop primitives, an initial loop structure. The method further includes positioning the layers of the tensor computation graph within a nested loop structure to provide a final loop structure, collapsing loops in the final loop structure, and mapping the collapsed loops to hardware components configured to execute the collapsed loops.

According to an embodiment, a system for transforming a high-level language representation of a tensor computation graph into a low level language is provided. The system includes processing circuitry configured to assign, for each input edge of each node in the tensor computation graph, a tensor shape, to assign, for each dimension of the input and output of each layer of the tensor computation graph, a loop primitive, and to generate, from the tensor computation graph and the assigned loop primitives, an initial loop structure. The processing circuitry is further configured to position the layers of the tensor computation graph within a nested loop structure to provide a final loop structure, to collapse loops in the final loop structure, and to map the collapsed loops to hardware components configured to execute the collapsed loops.

The processing circuitry can be provided, e.g., by a physical machine including compute resources, storage resources, and network resources. The compute resources can include, e.g., one or more processors each having one or more processor cores. The storage resources can include, e.g., computer readable memory, e.g., random-access memory (RAM) and/or cache memory. The network resources can include, e.g., a physical network interface controller (NIC). Such a physical machine can additionally include a bus that couples various system components, e.g. the processors and the computer readable memory, together. The network interface controller enables it to interface with other components. In addition, such a physical machine can host one or more virtual machines (VMs) and/or one or more containers. Each VM and/or container can be, e.g., an isolated environment that occupies a share of the compute, storage, and network resources of the physical machine. In other words, the physical machine hosts isolated environments that utilize the compute resources, storage resources, and network resources thereof.

In the literature, the following terms can be used in an analogous manner: "layer=operation," "neural network=computation graph," and "merging=fusing."

The systems, methods, and computer readable media of the present disclosure enable solutions to the above mentioned problems in a fully automatic manner. The systems, methods, and computer readable media of the present disclosure only require the computation graph and a description of the supported operators as input.

The systems, methods, and computer readable media of the present disclosure define tensor operations to consist of three components: (1) the tensor shape of all inputs and outputs, (2) the executed mathematic operations, e.g., +, *, /, sqrt, exp, convolution, tiling, etc., and (3) the manner via which input elements are accessed. In embodiments, the manner via which input elements are accessed relates to the use of loop primitives and Einstein notation mapping. Einstein notation mapping ensures that input dimensions are accurately mapped onto output dimensions, and the use of loop primitives specifies the manner in which the input dimensions are accessed—e.g. linearly, as a pooling or interpolation, etc.

In elementwise operations, the inputs and output use the identical linear loop indices, except in dimensions that are broadcast. For example given A[1][3][7]*B[7][3][1] results in C[7][3][7] as the first dimension of A and last of B are broadcast to the other one's size—as is shown in the following elementwise broadcasting code (which provides an example of state-of-the-art tensor broadcasting):

```
for a in range(7):
    for b in range(3):
        for c in range(7):
            C[a][b][c]=A[0][b][c]*B[a][b][0]
```

In contrast to the state-of-the-art, which assigns a shape to a layer itself, the systems, methods, and computer readable media of the present disclosure assign a tensor shape to the input/output edges of an operation. This provides certain advantages. First, view/reshape/flatten operations are not needed, as they are encoded into the system by way of each operation implicitly performing a "reshape" on its input edges. This facilitates the mapping of dimensions between the input and output edges of adjacent operations. In this manner, i.e. by assigning a tensor shape to the input/output edges of an operation, the systems, methods, and computer readable media of the present disclosure render "no-ops," i.e. operations that perform no computations on the data of a tensor but merely change its shape, obsolete.

Figure 6A:
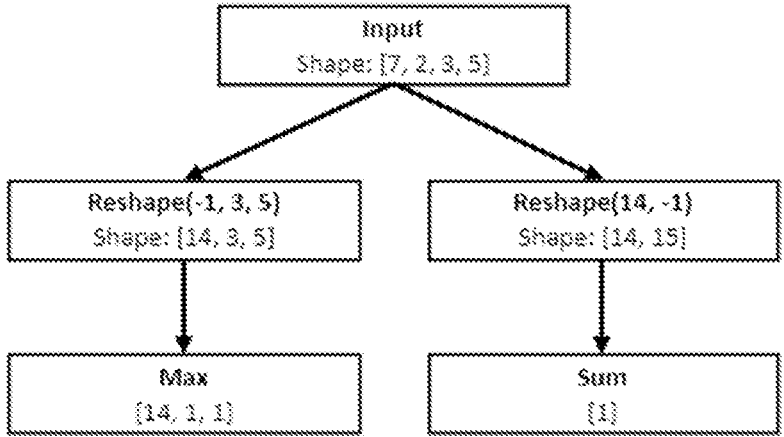
FIG. 6A illustrates an example tensor computation graph expressed in a conventional manner.
Figure 6B:
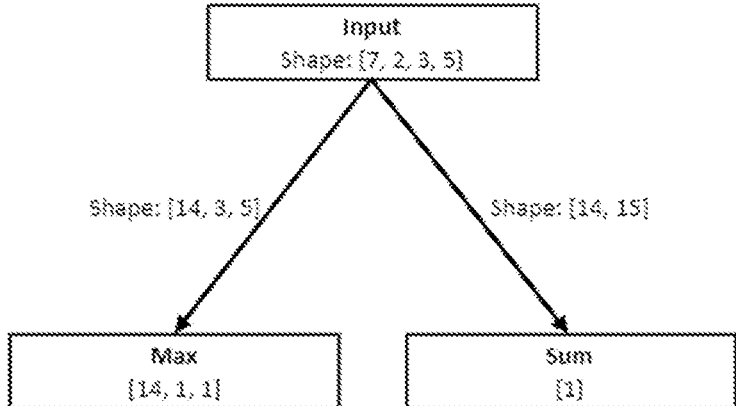
FIG. 6B illustrates a tensor computation graph expressed in accordance with a technique according to an embodiment of the present disclosure.

FIG. 6A and FIG. 6B illustrate, respectively, an example tensor computation graph expressed in the conventional manner and a tensor computation graph expressed in accordance with a technique according to an embodiment of the present disclosure. Specifically, in FIG. 6A, the conventional expression of a tensor computation graph provides an input layer, a subsequent layer providing parallel reshape operations, and a further layer including parallel Max and Sum operations. By contrast, in FIG. 6B, the expression of the tensor computation graph in accordance with the techniques of the present disclosure assigns a shape to edges of the graph that connect the input layer to parallel Max and Sum operations. In this manner, the reshape operations—which do nothing but change the output shape—are omitted and, as a result, an entire layer of the tensor computation graph is eliminated.

Specifically, in FIG. 6A, an input node provides data that comes from outside the computational graph (the input node is not a layer that performs any mathematical operation) in the form of a tensor with the shape [7, 2, 3, 5], the input data is reshaped by two reshape nodes to provide tensors with the shapes [14, 3, 5] and [14, 15], and then a maximum reduction is performed. In FIG. 6B, the reshape layers are omitted and the edges connected to the input node define shapes of the tensors that are input to the Max and Sum operations.

Consider a sequence of operations, for example:

A[1][3][224][224]=random(1, 3, 224, 224)
B[1][64][64][64]=Conv(A)

C[1][192]=Flatten(B)
D[1][1000]=Dense(C)

Using the techniques of the present disclosure, via which tensor shapes are assigned to the input/output edges of an operation, the preceding sequence of operations becomes:

A[1][3][224][224]=random(1, 3, 224, 224)
B[1][64][64][64]=Conv(A[1][3][224][224])
D[1][1000]=Dense(C[1][192])

The techniques of the present disclosure thereby allow for the Flatten(B) operation to be omitted because the Dense operation defines its own input shape. As a result, the flatten layer can be omitted from, e.g., a neural network. By omitting the flatten layer from the neural network, the optimization problem whereby a tensor compiler generates an optimized nested loop structure corresponding to the tensor computation graph is simplified. In this manner, i.e. by storing tensor shapes in the input/output edges of the computation graph and omitting explicit reshaping operations, loop primitives can be assigned to edges of each operation which facilitates the generation of a minimal nested loop structure in a low-level language/machine code that in turn yields substantial performance improvements in the executable generated from the high-level source code.

FIG. 1 illustrates a complex parallel tensor computation graph. The tensor computation graph illustrated in FIG. 1 is an example of a tensor computation graph that can be expressed in a high level language (e.g. PyTorch, Numpy, TensorFlow, and any other language that models computations as a tensor-based programming model and/or generates a tensor computation graph), and transformed, via the techniques of the present disclosure, into a nested loop structure provided in a low-level language/machine code.

Figure 2:
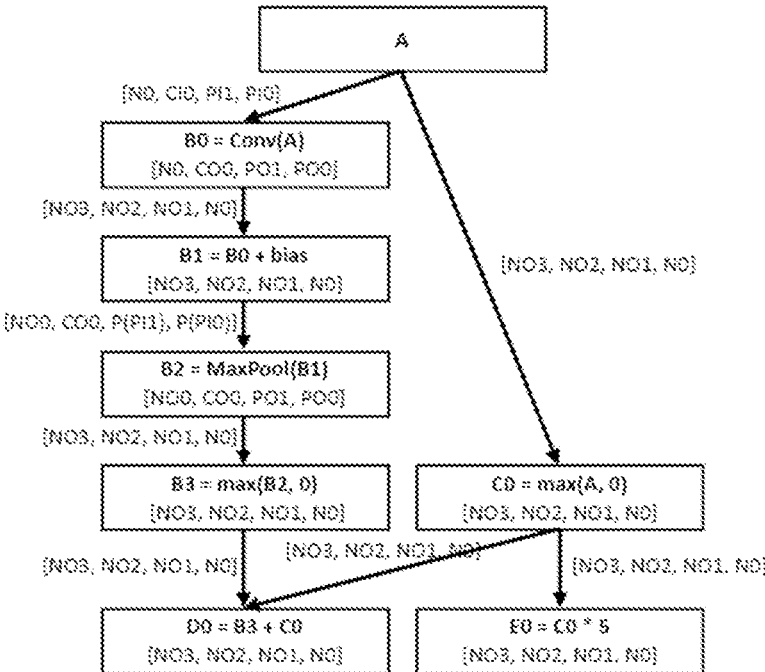
FIG. 2 illustrates the complex parallel computation graph of FIG. 1 annotated with dimension mapping in accordance with an embodiment of the present disclosure.

FIG. 2 illustrates the complex parallel computation graph of FIG. 1 annotated with dimension mapping in accordance with an embodiment of the present disclosure. The systems, methods, and computer readable media of the present disclosure assign loop primitives to each dimension of the input and output of each respective operation of the complex parallel computation graph of FIG. 1.

For example in pooling operations, the ability to handle non-linear loops is required. The index of an input pixel in a pooling operation is defined as: input_index=output_index*stride+kernel_index*dilation+padding. The index of the input is computed by a linear combination of two linear loops: output_index and kernel_index.

The systems, methods, and computer readable media of the present disclosure are not limited to poolings, but can also be applied to any kind of interpolations, global/adaptive poolings and other kind of operations that rely on non-linear indexing.

To enable specialized indexing, all operations that shall be merged are first iterated through, and respective loop primitives (linear, pooling, interpolation, . . . ) are assigned to the specific dimensions of their inputs and outputs, e.g. as illustrated in FIG. 2. Loop primitives translate, to a formula, the manner in which the index of a dimension is computed. Loop primitives are, in principle, a collection of formulas used to compute indices to access Tensors. A pooling loop primitive, for example, might define the formula Pooling: Tensor[L*stride—padding+K*dilation] for (L=0; L<5; L++) and for (K=0; K<3; K++). Further examples of loop primitives include AdaptivePooling, ReversePooling, ReserveAdaptivePooling, Interpolation, ReverseInterpolation, etc. For example, loop primitive assignment for a 2D MaxPooling operation can be specified as follows:

output[linear][linear][linear][linear]=MaxPooling(input [linear][linear][pooling][pooling]).

That is, for each dimension of the input and output, a loop primitive is assigned thereto that provides a formula for the manner in which the index of that respective dimension is computed. In FIG. 2, for example, the MaxPool layer uses [NO0, CO0, PO1, PO0] as output and [NO0, CO0, P(PI1), P(PI0)] as input shape. The NO0 and CO0 are linear-loop-primitives and have the same identifier. So these two can use the same linear loop. P(*) means this is a pooling-loop-primitive and PInput1 is the input dimension of POutput1. This way our invention knows, that PO1 is a linear loop, and it needs to create inner loops for the loop-primitive that gets assigned to the 3rd dimension of the input.

In a next step, an initial schedule for executing operations is created. In reference to the complex parallel computation graph depicted in FIG. 1, the following operations are assumed:

B0=Conv(A)
    B1=B0+bias
    B2=MaxPool(B1)
    B3=max(B2, 0)
    C0=max(A, 0)
    D0=B3+C0
    E0=C0*5

In the complex parallel computation graph depicted in FIG. 1, two parallel computation paths are combined in operation D0. In the scheduling algorithm, each operation is ranked from back to front. This results in the following ranking:

0. [D0, E0]
    1. [C0, B3]
    2. [B2]
    3. [B1]
    4. [B0]

The idea for this ranking is to guarantee the order or execution. As, e.g., B0 needs to be available before B1 can be computed, it needs to have a higher rank. This method produces a sequential ordering of a computation graph that can have multiple parallel paths. With this approach, i.e. back-to-front scheduling, it can be guaranteed that results are computed only when needed and that results are not kept in memory that are not needed for current computations.

This ranking tells us which operations depend on each other and which operations do not (e.g. C0 and B3), and that operation C0 can be postponed to be executed after B2 has been computed such that it is not necessary to keep the result of C0 in memory. This is a kind of "lazy scheduling," computing all operations as latest as possible. In other words, C0 is executed after B3 because it is not necessary to keep the data of C0 in memory while B0, B1, and B2 are processed.

In a next step, linear loops are initialized. Linear loops, which are the most basic loop primitives, only depend on a single loop index and do not have any other dependencies. This is contrasted with non-linear loops, e.g. pooling primitives that rely on the output-loop-index and the kernel-loop-index. For example, for the operation output[. . . ][. . . ][A][B]=MaxPooling(input[. . . ][. . . ][Pooling(A, Ka)] [Pooling(B, Kb)]), the pooling primitives can use the loop indices A and B, but they must be initialized and assigned to the output first.

An Einstein-Notation-like dimension mapping is used. In principle, Einstein-Notation is a very limited programming language that facilitates the expression of Basic Linear Algebra Subprogram (BLAS)-like layers. In an element-wise operation all input dimensions map those of the output B[a][b][c]=A[a][b][c]. However, in a permute operation, the dimensions are swapped, so for example: B[a][b][c]=A[c][b][a] (depending on the actual permutation that shall be applied). This mapping is part of the operation description itself and therefore does not need to be defined manually by the user.

Starting with the first operation (D0) with the lowest rank, all linear loop primitives with a unique loop index are initialized.

In a second step, all non-linear loop primitives such as poolings or interpolations are initialized. These are usually based on the linear loops that have previously been initialized.

Next, all directly connected (e.g. C0 and B3, where the difference in rank between two nodes is 1) operations are initialized.

Due to the assignment of shapes onto the input edges by the systems, methods, and computer readable media of the present disclosure, operations have separate shapes for input and output and it can happen that the output of an operation, e.g., [3][7][1][3], is different from the input of the consecutive operation, e.g. [3][7][3]. To support these cases, dimensions can be mapped by using the size and stride of the shape, and "squeezing" all unmatched dimensions with size 1. A squeeze is a maintenance layer (similar to view, reshape, and flatten layers) that removes a dimension of size 1 to reduce the dimensionality of the tensor. For example, applying a squeeze to a [1][5][13][7][1][2] tensor provides a [5][13][7][1][2] tensor.

The techniques of the present disclosure provide, for example in the event one layer has an output with shape [7][3][5] and the following layer has an input with shape [7][3][1][5], for the loops for the [7], [3], and [5] dimensions to be mapped to one another (i.e. the [7], [3], and [5] dimensions can be merged) because the [1] dimension does not change the stride. Nevertheless, the layers are computed for a 3D tensor for the first layer and for a 4D tensor for the following layer. As another example, the techniques of the present disclosure provide, in the event an output of one layer has shape [3][7][1][3] and the input of a consecutive layer has shape [3][21], for automatic detection that only the first dimension can be merged due to the differing size in the other dimensions. For all matched dimensions, the loop index is copied over.

Systems, methods, and computer readable media of the present disclosure not only iterate the ranks upwards, but also downwards if it is detected that there is a directly connected node, e.g., C0->E0.

After this inheritance phase, the procedure is repeated for the current operation, and initializing of all linear loop primitives that have not been copied over from any other operation before is started. The following code shows the result of a loop index initialization.

B0[L0][L1][L6][L7]=Conv(A[L0][L8][pooling(L6, L9)][pooling(L7, L10)], weight[L6][L8][L9][L10])
    B1[L0][L1][L6][L7]=Bias(B1[L0][L1][L6][L7], bias[L1])
    B2[L0][L1][L2][L3]=MaxPool(B1[L0][L1][pooling(L2, L4)][pooling(L3, L5)])
    B3[L0][L1][L2][L3]=max(B2[L0][L1][L2][L3], 0)
    C0[L0][L1][L2][L3]=max(A [L0][L1][L2][L3], 0)
    D0[L0][L1][L2][L3]=B3[L0][L1][L2][L3]+C0[L0][L1][L2][L3]
    E0[L0][L1][L2][L3]=C0[L0][L1][L2][L3]*5

In this Preliminary loop nesting, all indices on the left side of the = indicate write-loops. All indices that are only on the right side are read-loops. Each of the L0, L1, . . . , L9 in the above example represent loop indices. For example, in the above example, the operation E0 is used as a starting point and the loop indices L0, L1, L2, and L3 are assigned to the dimensions thereof. The operation C0 uses the same loop primitives and dimension mapping as the operation E0, so the loop indices L0, L1, L2, and L3 are also assigned to the dimensions of C0. At this point, there are no pooling or other loop primitives. However, they would be initialized prior to moving to the next step. Next, the loop indices L0, L1, L2, and L3 are propagated to every directly connected layer that differs in rank by at most 1 from the current layer. Because the dimensions (i.e. size+stride) match for all dimensions, the loop indices can be carried over to D0 and B3. The process then checks whether there are any loops not initialized before repeating the preceding steps for the next layer. Note that, while layers A and D0 are directly connected, the distance (i.e. difference in rank) between A and D0 is >1, so the loop indices are not copied over from D0 to A.

Figure 3:
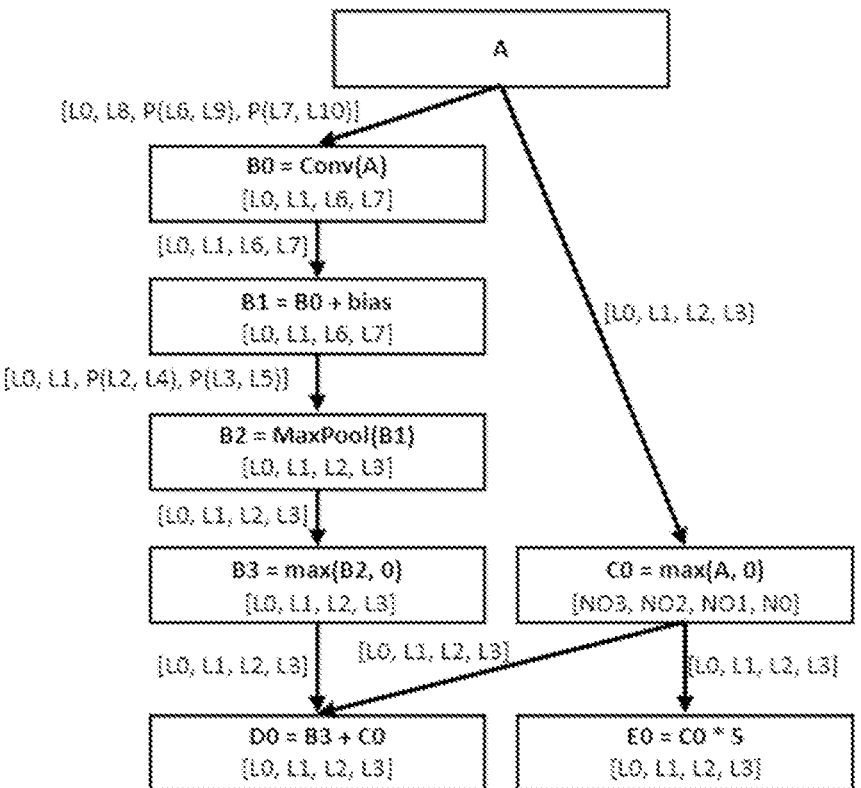
FIG. 3 illustrates the complex parallel computation graph of FIG. 1 with a loop assignment provided in accordance with an embodiment of the present disclosure.

FIG. 3 illustrates the complex parallel computation graph of FIG. 1 with a loop assignment provided in accordance with an embodiment of the present disclosure. The loop assignment illustrated in FIG. 3 is the result of the steps of (i) creating an initial schedule for executing operations, (ii) ranking the operations to provide a back-to-front scheduling, (iii) initializing all linear loop primitives with a unique loop index, (iv) initializing all non-linear loop primitives, (v) initializing all directly connected operations and proceeding sequentially to initialize all operations.

After this step, a rough loop nesting results and a loop based scheduling can be performed. A hierarchical tree-like data-structure is built up that contains the linear write-loops and all operations:

```
L0 {
    L1 {
        L2 (depends on: B0, B1) {
            B2 = MaxPool(...)
            B3 = max(...)
            C0 = max(...)
            D0 = B3 + B0
            E0 = C0 * 5
        }
        L6 {
            L7 {
                B0 = Conv(...)
                B1 = Bias(...)
            }
        }
    }
}
```

Systems, methods, and computer readable media of the present disclosure traverse this tree and select any node, that does not have any dependencies, starting with L0. Within that node, L1 is selected as it does not have any dependencies. Within L1, L2 and L6 are had, where L6 is selected, as it does not have any dependencies. This is continued until the operations B0 and B1 are reached, which are then marked as executed. Next only L2 is not left, which has B0 and B1 as dependencies. As these have now been marked as executed, processing the operations within L2 can be continued.

This produces the final schedule:

```
L0 {
    L1 {
```

-continued

```
        L6 {
            L7 {
                B0 = Conv(...)
                B1 = Bias(...)
            }
        }
        L2 {
            B2 = MaxPool(...)
            B3 = max(...)
            C0 = max(...)
            D0 = B3 + B0
            E0 = C0 * 5
        }
    }
}
```

In a next step, the final loop structure is generated with all low level operations that are performed by high level operations, shown in the final schedule above. Here loops are that are used for writing are distinguished from those for pure reading. E.g., loops L8-L10 only read values that are summed in a variable sum, and then written to B1 inside the loop L7. These write/read labels become important in a later step. A nested loop structure with low level operators is shown below:

```
for L0 in range(...): # write
    for L1 in range(...): # write
        for L6 in range(...): # write
            for L7 in range(...): # write
                sum = 0
                for L8 in range(...): # read
                    for L9 in range(...): # read
                        for L10 in range(...): # read
                            sum += A[L0][L8][pooling(L6,
L9)][pooling(L7, L10)] * weight[L6][L8][L9][L10]
                B1[L1][L6][L7] = B0 + bias [L1]
        for L2 in range(...): # write
            for L3 in range(...): # write
                B2 = -inf
                for L4 in range(...): # read
                    for L5 in range(...): # read
                        B2 = max(B2, B1[pooling(L2, L4)][pooling(L3,
L5)])
                B3 = max(B2)
                C0 = max(A[L0][L1][L2][L3])
                D0[L0][L1][L2][L3] = B3 + C0
                E0[L0][L1][L2][L3] = C0 * 5
```

Figure 4:
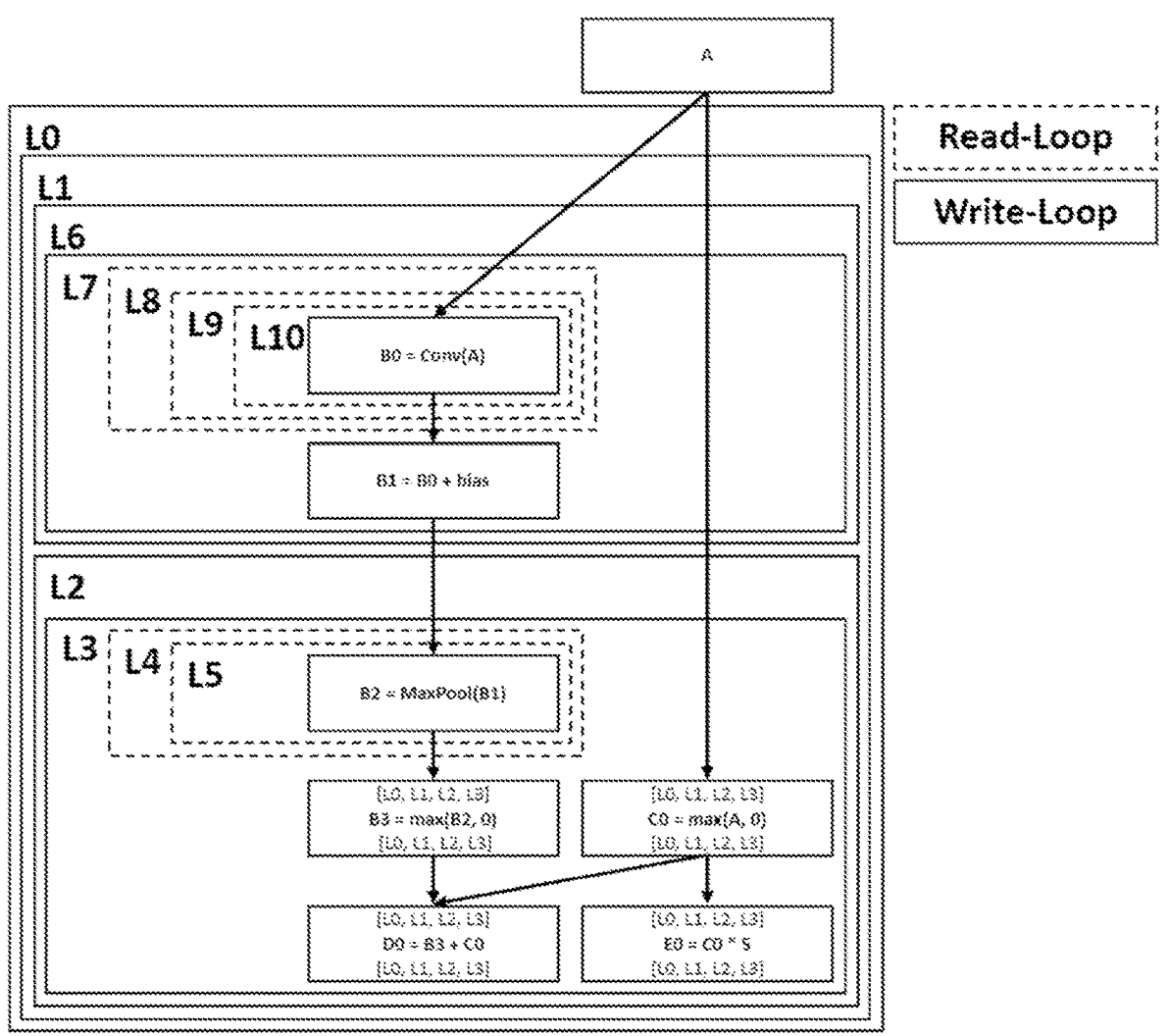
FIG. 4 illustrates, according to an embodiment of the present disclosure, a loop structure corresponding to the complex parallel computation graph of FIG. 1.

FIG. 4 illustrates a final loop structure corresponding to the complex parallel computation graph of FIG. 1, in which each layer has been assigned to its proper position within the overall nested loop structure. The final loop structure illustrated in FIG. 4 is the result of the aforementioned building of a hierarchical tree-like data-structure, traversal of the tree and selection of nodes based on dependencies, and the distinguishing of loops that are used for writing from those for pure reading.

While the foregoing code for the nested loop structure with low level operators (corresponding to FIG. 4) is already well merged and compacted, it can still not efficiently be mapped onto modern vector-based hardware such as CPUs, Vector Processors or GPUs. In a next step, all loops that access adjacent dimensions within the tensors, e.g., L0 and L1 (in tensor B1), are collapsed. An example collapsed nested loop structure is shown below:

```
for L0, L1 in range(...): # write
  for L6, L7 in range(...): # write
    sum = 0
    for L8 in range(...): # read
      for L9 in range(...): # read
        for L10 in range(...): # read
          sum += A[L0][L8][pooling(L6, L9)][pooling(L7, L10)]
* weight[L6][L8][L9][L10]
    B1[L1][L6, L7] = B0 + bias[L1]
  for L2, L3 in range(...): # write
    B2 = -inf
    for L4 in range(...): # read
      for L5 in range(...): # read
        B2 = max(B2, B1[pooling(L2, L4)][pooling(L3, L5)])
    B3 = max(B2)
    C0 = max(A[L0][L1][L2][L3])
    D0[L0, L1][L2, L3] = B3 + C0
    E0[L0, L1][L2, L3] = C0 * 5
```

Loop Collapsing itself is a widely used method, i.e., OpenMP has the #pragma omp for collapse(2) pragma that collapses the next 2 for loops into a single one.

Now the loops can be assigned onto the cores and vector units of the processor, indicated by the keywords cores and vector. For cores, the most outer loops are chosen. For vector, loops that access the inner most dimensions of tensors are chosen. This is important as vector instructions perform best when accessing directly adjacent elements, otherwise they require the performance of costly gather/scatter operations. See "Special Cases" for a more detailed example on this.

```
cores L0, L1 in range(...): # write
  vector L6, L7 in range(...): # write
    sum = 0
    for L8 in range(...): # read
      for L9 in range(...): # read
        for L10 in range(...): # read
          sum += A[L0][L8][pooling(L6, L9)][pooling(L7, L10)]
* weight[L6][L8][L9][L10]
    B1[L1][L6, L7] = B0 + bias[L1]
  vector L2, L3 in range(...): # write
    B2 = -inf
    for L4 in range(...): # read
      for L5 in range(...): # read
        B2 = max(B2, B1[pooling(L2, L4)][pooling(L3, L5)])
    B3 = max(B2)
    C0 = max(A[L0][L1][L2][L3])
    D0[L0, L1][L2, L3] = B3 + C0
    E0[L0, L1][L2, L3] = C0 * 5
```

Figure 5:
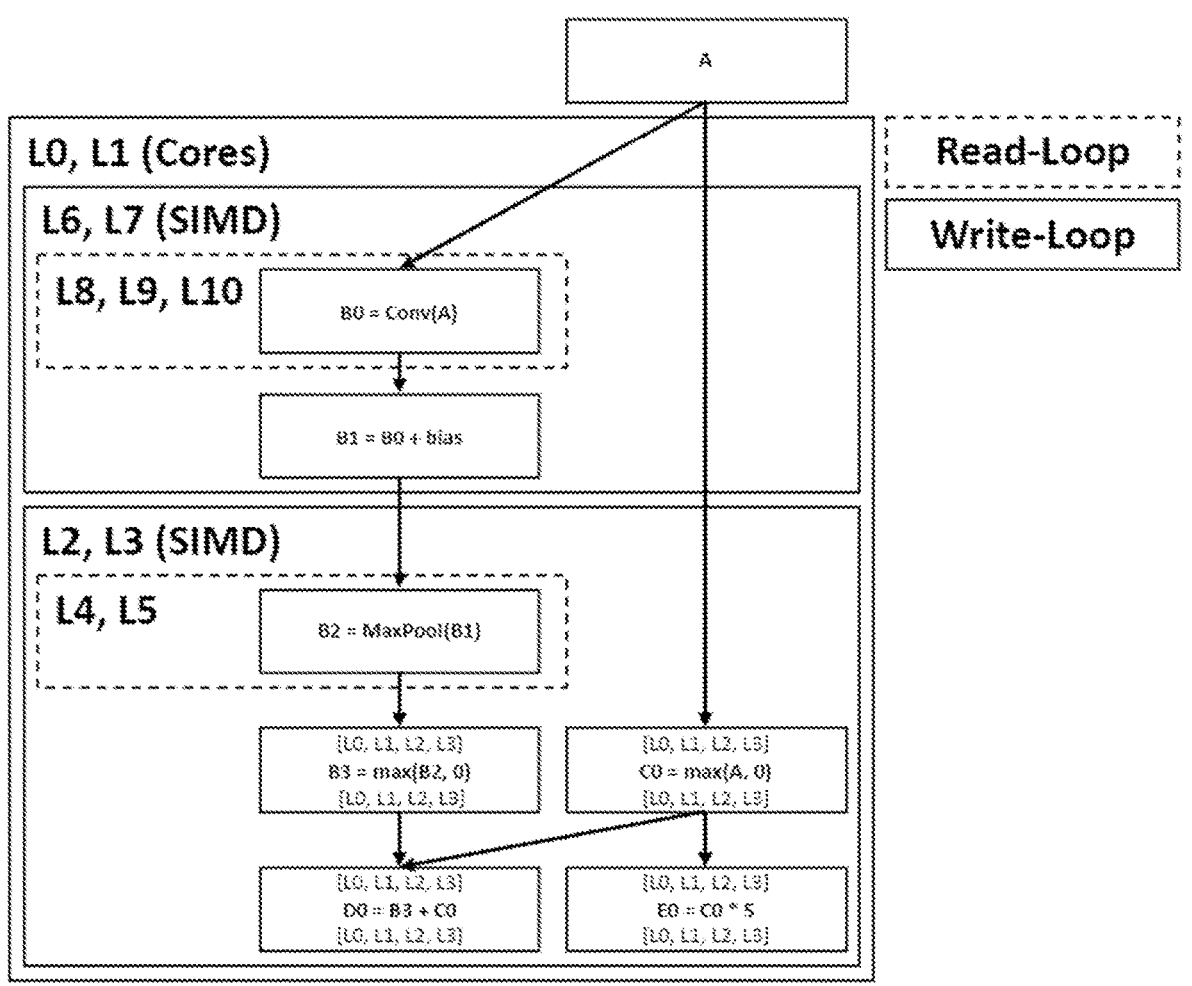
FIG. 5 illustrates, according to an embodiment of the present disclosure, a graph corresponding to the loop structure of FIG. 4 in which the loops are collapsed and cores and single instruction, multiple data (SIMD) primitives are assigned to corresponding collapsed loops.

FIG. 5 illustrates, according to an embodiment of the present disclosure, a graph corresponding to the loop structure of FIG. 4 in which the loops are collapsed and cores and single instruction, multiple data (SIMD) primitives are assigned to corresponding collapsed loops. The graph illustrated in FIG. 5 is the result of the foregoing collapsing of all loops that access adjacent dimensions within the tensors, e.g., L0 and L1 (in tensor B1), and of the foregoing assignment of the loops onto the cores and vector units of the processor.

In principle this can be done by any auto-vectorizing compiler. Transition steps form a high level representation to a nested loop structure are not performed by traditional compilers, but the code generated at this point can be passed onto an auto-vectorizing compiler that performs mapping of loops onto vector-instructions and different cores. The techniques of the present disclosure generate code for which mapping of loops by an auto-vectorizing compiler is straightforward.

Figure 7A:
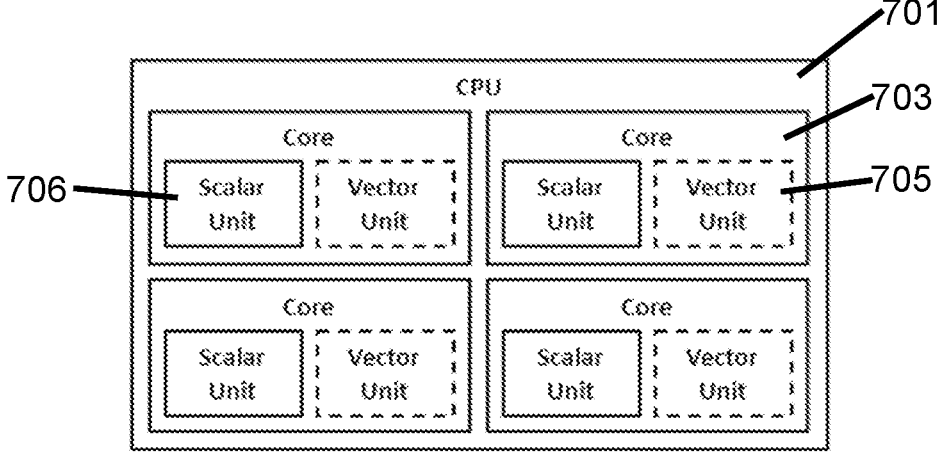
FIG. 7A illustrates the hardware structure of an example CPU.
Figure 7B:
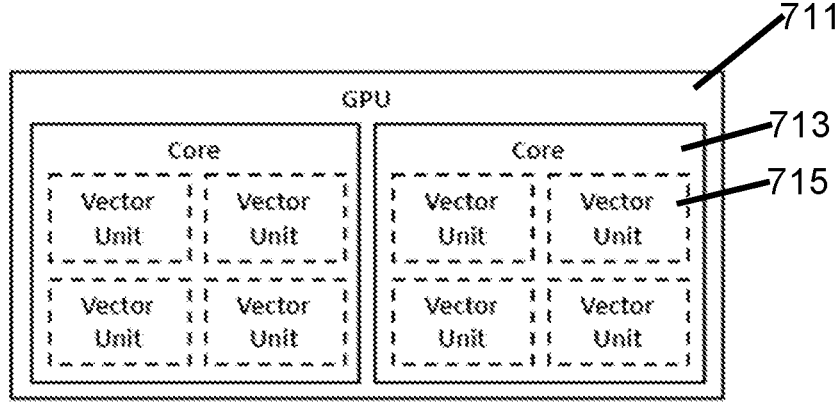
FIG. 7B illustrates the hardware structure of an example GPU.

FIG. 7A illustrates the hardware structure of an example CPU, while FIG. 7B illustrates the hardware structure of an example GPU. In the CPU 701 of FIG. 7A, multiple cores, e.g. 703, are provided that each has a scalar unit, e.g. 705, and a vector unit, e.g. 706. In the GPU 711 of FIG. 7B, multiple cores, e.g. 713, are provided that each include multiple vector units, e.g. 715. A single vector unit can be formed, for example, from a plurality of Compute Unified Device Architecture (CUDA) cores that provide for parallel processing.

There are, in addition, certain special cases that require further attention.

In cases of pure elementwise operations, after collapsing the loops, the result is:

```
for a, b, c, d in range( . . . ): # write
  output[a, b, c, d]=operation(input[a, b, c, d])
```

In this case, the cores- and vector-loops need to be combined into a cores-vector-loop, that distributes all items equally onto the cores and vector units. Such a cores-vector-loop is a special case that may need to be handled when assigning the final loop type.

In BatchNormalization, the mean and variance are computed across the channels of the input. An initial loop structure for such a batch normalization operation is provided below:

```
N = (BATCH * Y * X)
for channels in range(...): # write
  sum = 0
  for batch in range(...): # read
    for y in range(...): # read
      for x in range(...): # read
        sum += input[batch][channels][y][x]
  mean[channels] = sum / N
  sum = 0
  for batch in range(...): # read
    for y in range(...): # read
      for x in range(...): # read
        sum += pow(input[batch][channels][y][x] – mean[channels], 2)
  var[channels] = sum / (N–1)
```

As can be seen, there is only one write loop (channels), but the data stride for channels is 1 in variable var and x*y in variable input. Therefore it would be unwise to choose channels to be vectorized. Instead, channels are assigned to be of type cores, and then the read loops are collapsed and vectors are assigned to the read loops that only access tensors with have data stride ==1. The resulting vectorized read loops are shown below:

```
N = (BATCH * Y * X)
cores channels in range(...): # write
  sum = 0
  for batch in range(...): # read
    vector y, x in range(...): # read
      sum += input[batch][channels][y, x]
  mean[channels] = sum / N
  sum = 0
  for batch in range(...): # read
    vector y, x in range(...): # read
      sum += pow(input[batch][channels][y, x] – mean[channels], 2)
  var[channels] = sum / (N–1)
```

In such vectorized read loops, the sum of both inner loops needs to be a scalar value, but the inner loops are vectorized. Therefore, further vector-reduction instructions need to be added to sum up entries from the vector registers into a single scalar value. The resulting vectorized read loops are provided below:

```
N = (BATCH * Y * X)
cores channels in range(...): # write
    sum = 0
    for batch in range(...): # read
        vector y, x in range(...): # read
            sum += input[batch][channels][y, x]
    mean[channels] = reduce_add(sum) / N
    sum = 0
    for batch in range(...): # read
        vector y, x in range(...): # read
            sum += pow(input[batch][channels][y, x] – mean[channels], 2)
    var[channels] = reduce_add(sum) / (N–1)
```

As can be seen, the batch-loop is not collapsed into the vector-loop, because the indices when accessing input are not adjacent to y and x, therefore they do not form a vector and instead would require using an inefficient gather operation.

The same needs to be applied in any sum/reduce-like operations where the innermost dimensions are reduced, see following two examples of parallelization/vectorization for reducing an inner dimension and an innermost dimension:

```
cores a in range(...): # write
    vector b in range(...): # write
        sum = 0
        for c in range(...): # read
            sum += input[a][c][b]
        output[a][c] = sum
cores a, b in range(...): # write
    sum = 0
    vector c in range(...): # read
        sum += input[a, b][c]
    output[a, b] = reduce_add(sum)
```

In contrast to vector, mapping cores onto read-loops is never considered, because this would require using atomic operations that are very slow and should be avoided in compute-heavy scenarios.

The Tile or Repeat operation enables repetition of data within a tensor. The input/output of a tile operation is provided below:

```
input = [
    [1, 2, 3],
    [4, 5, 6]
]
# output = Tile(input, [1, 2])
output = [
    [1, 2, 3, 1, 2, 3],
    [4, 5, 6, 4, 5, 6]
]
```

In this case the input and output shapes use the identical linear loops, but the inner uses the modulo operator. This is indicated by splitting each dimension into a loop- and data-size. Normally these are identical, except for tiling operations, where data-size <loop-size. The inheritance of the previously explained loop indices operates on the loop-size, and the handling of indices in a tile operation is shown below:

```
for L0 in range(...):
    for L1 in range(...):
        output[L0][L1] = input[L0][L1 % 3]
```

Another special case are offsets. For example, in Concat operations, each input is written to a different place within the output. An example of memory access offsets is as follows:

```
for L0 in range(...):
    for L1 in range(...):
        for L2 in range(...):
            output[L0][L1 + offset_0][L2] = input_0[L0][L1][L2]
        for L3 in range(...):
            for L2 in range(...):
                output[L0][L3 + offset_1][L2] = input_1[L0][L3][L2]
```

In this case, loop-size <data-size and offset >=0. It can be concluded that each of our shape-dimensions not only consists of a single numeric size, but a tuple of loop-size, data-size, offset and data-stride.

Another important case is when entire dimensions are reduced, i.e., in sum/reduce or pooling operations. Assume the following case to demonstrate the problem of input loop merging:

$B[1][32][16][16]=ReLU(A[1][32][16][16])$
$C[1][32][1][1]=Sum(B[1][32][16][16])$

Systems, methods, and computer readable media of the present disclosure can initialize the preceding case to provide the following initialized loop indices:

$B[L0][L1][L4][L5]=ReLU(A[L0][L1][L4][L5])$
$C[L0][L1][L2][L3]=Sum (B[L0][L1][L4][L5])$

This naively would result in the following loop structure:

```
for L0, L1 in range(...): # write
    for L4, L5(...): # write
        B[L4, L5] = ReLU(A[L0, L1][L4, L5])
    # L2 and L3 get omitted because their size == 1
    sum = 0
    for L4, L5(...): # read
        sum += B[L4, L5]
    C[L0, L1] = sum
```

As can be seen, the loop structure for L4 and L5 is duplicated, once for reading once for writing. This is not necessary and therefore systems, methods, and computer readable media of the present disclosure can add all operations of read loops to previously scheduled write loops, if they use the identical loop indices. The final loop structure in this case looks like the following final input loop merged code:

```
for L0, L1 in range(...): # write
    sum = 0
    for L4, L5(...): # write
        B = ReLU(A[L0, L1][L4, L5])
        sum += B
    C[L0, L1] = sum
```

The aforementioned techniques for compiling high-level language source code, which specifies a tensor computation graph, into a nested loop structure expressed in a low level language/machine code improve the runtime performance of programs that perform tensor computations. In particular, the aforementioned techniques reduce memory read/write instructions and to keep as much relevant data as possible, for as long as possible, in registers and the caches of the device executing the programs that perform the tensor computations. The aforementioned techniques provide low level language/machine code with reduced complexity achieved by the assignment of shapes and loop primitives onto edges of a tensor computation graph expressed in high-level language code. As a result, the device executing a program that performs tensor computations doesn't need constantly access information pertaining to the input/output shapes of both a current and a previous layer, nor does the current layer need to memorize how the input-shape is mapped onto loop primitives. Instead, known sizes are encoded directly into the code. In the state of the art, for example, a statement such as:

for(int I=0; I<input_shape[0]; i++); is required, where input shape is a runtime information. However, the present disclosure, by defining the tensor shape in the input edge, allows the runtime information to be eliminated, e.g.:

$$\text{for(int } I = 0; I < 5; i++).$$

In this manner, there is no need to "memorize" any information in input shape[0].

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A computer-implemented method for transforming a high-level language representation of a tensor computation graph into a low level language, the computer-implemented method comprising:

assigning, for each input edge of each node in the tensor computation graph, a tensor shape;

assigning, for each dimension of the input and output of each layer of the tensor computation graph, a loop primitive;

generating, from the tensor computation graph and the assigned loop primitives, an initial loop structure;

positioning the layers of the tensor computation graph within a nested loop structure to provide a final loop structure;

collapsing loops in the final loop structure;

mapping the collapsed loops to hardware components configured to execute the collapsed loops; and executing the collapsed loops using the hardware components based on the mapping of the collapsed loops.

2. The computer-implemented method according to claim 1, further comprising defining, for the tensor computation graph, an available set of operators and loop primitives.

3. The computer-implemented method according to claim 1, wherein the generating the initial loop structure comprises:

generating an initial schedule for executing layers of the tensor computation graph;

ranking, based on the initial schedule, the layers of the tensor computation graph;

initializing linear loops according to loop primitives assigned to the dimensions of the input and output of each layer of the tensor computation graph;

initializing non-linear loops based on the initialized linear loops; and inheriting linear loops to direct neighbor layers in the tensor computation graph.

4. The computer-implemented method according to claim 3, wherein Einstein-Notation dimension mapping is used for initializing the linear loops.

5. The computer-implemented method according to claim 4, wherein initializing linear loops according to the loop primitives assigned to the dimensions of the input and output of each layer of the tensor computation graph is performed based on the ranking of the layers of the tensor computation graph.

6. The computer-implemented method according to claim 1, wherein the positioning the layers of the tensor computation graph within a nested loop structure to provide a final loop structure comprises:

generating a hierarchical tree structure that includes loops and all layers of the tensor computation graph;

determining, based on the hierarchical tree structure, dependencies of the loops; and classifying the loops as one of a write-loop or a read-loop.

7. The computer-implemented method according to claim 1, wherein mapping the collapsed loops to hardware components configured to execute the collapsed loops is performed by an auto-vectorizing compiler.

8. The computer-implemented method according to claim 1, wherein the high level language is a tensor-based programming model.

9. The computer-implemented method according to claim 1, wherein the low level language is machine code.

10. The computer-implemented method according to claim 9, wherein the machine code is code for a central processing unit (CPU) or a graphics processing unit (GPU).

11. The computer-implemented method according to claim 1, wherein the low level language is one of C/C++, very high-speed integrated circuits program (VHSIC) hardware description language (VHDL), or Verilog.

12. The computer-implemented method of claim 1, wherein the hardware components comprise one or more central processing units (CPUs), one or more vector processors, or one or more graphics processing units (GPUs), wherein mapping the collapsed loops to the hardware components comprises mapping the collapsed loops to the one or more CPUs, the one or more vector processors, or the one or more GPUs, and wherein executing the collapsed loops comprises executing the collapsed loops based on the mapping of the collapsed loops to the one or more CPUs, the one or more vector processors, or the one or more GPUs.

13. The computer-implemented method of claim 1, wherein the hardware components comprise at least one central processing unit (CPU) comprising a plurality of processor cores, wherein mapping the collapsed loops to the hardware components comprises:

mapping a first collapsed loop of the collapsed loops to a first processor core of the plurality of processor cores; and mapping a second collapsed loop of the collapsed loops to a second processor core of the plurality of processor cores, and wherein executing the collapsed loops comprises executing the first collapsed loop using the first processor core and executing the second collapsed loop using the second processor core.

14. The computer-implemented method of claim 1, wherein the hardware components comprise a plurality of processor cores, wherein the plurality of processor cores comprise scalar units and/or vector units, wherein each of the vector units comprises a plurality of Compute Unified Device Architecture (CUDA) cores, and wherein mapping the collapsed loops to the hardware components comprises mapping the collapsed loops to the scalar units and/or the vector units of the plurality of processor cores.

15. The computer-implemented method of claim 14, wherein the collapsed loops comprise loops that access an inner-most dimension of tensors, wherein the mapping the collapsed loops to the vector units is based on the loops that access the inner-most dimension of tensors, and wherein executing the collapsed loops comprises executing the loops that access the inner-most dimension of tensors using the vector units.

16. The computer-implemented method of claim 14, wherein the collapsed loops comprise inner loops and outer loops, and wherein mapping the collapsed loops to the scalar units is based on whether a collapsed loop, from the collapsed loops, is one of the inner loops or one of the outer loops.

17. A non-transitory computer readable medium having stored thereon instructions for carrying out a method for transforming a high-level language representation of a tensor computation graph into a low level language, the method comprising:

assigning, for each input edge of each node in the tensor computation graph, a tensor shape;

assigning, for each dimension of the input and output of each layer of the tensor computation graph, a loop primitive;

generating, from the tensor computation graph and the assigned loop primitives, an initial loop structure;

positioning the layers of the tensor computation graph within a nested loop structure to provide a final loop structure;

collapsing loops in the final loop structure;

mapping the collapsed loops to hardware components configured to execute the collapsed loops; and executing the collapsed loops using the hardware components based on the mapping of the collapsed loops.

18. The non-transitory computer readable medium according to claim 17, wherein the generating the initial loop structure comprises:

generating an initial schedule for executing layers of the tensor computation graph;

ranking, based on the initial schedule, the layers of the tensor computation graph;

initializing linear loops according to loop primitives assigned to the dimensions of the input and output of each layer of the tensor computation graph;

initializing non-linear loops based on the initialized linear loops; and inheriting linear loops to direct neighbor layers in the tensor computation graph.

19. The non-transitory computer readable medium according to claim 17, wherein the positioning the layers of the tensor computation graph within a nested loop structure to provide a final loop structure comprises:

generating a hierarchical tree structure that includes loops and all layers of the tensor computation graph;

determining, based on the hierarchical tree structure, dependencies of the loops; and classifying the loops as one of a write-loop or a read-loop.

20. A system for transforming a high-level language representation of a tensor computation graph into a low level language, the system comprising:

processing circuitry configured to:

assign, for each input edge of each node in the tensor computation graph, a tensor shape;

assign, for each dimension of the input and output of each layer of the tensor computation graph, a loop primitive;

generate, from the tensor computation graph and the assigned loop primitives, an initial loop structure;

position the layers of the tensor computation graph within a nested loop structure to provide a final loop structure;

collapse loops in the final loop structure;

map the collapsed loops to hardware components configured to execute the collapsed loops; and execute the collapsed loops using the hardware components based on the mapping of the collapsed loops.

* * * * *